(12) United States Patent
Tachikawa et al.

(10) Patent No.: US 6,348,523 B1
(45) Date of Patent: Feb. 19, 2002

(54) CURABLE COMPOSITION

(75) Inventors: Hiroyuki Tachikawa; Kozaburo Takachika; Seiichi Saito; Nobuhiro Nagayama, all of Tokyo (JP)

(73) Assignee: Asahi Denka Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/529,725

(22) PCT Filed: Aug. 20, 1999

(86) PCT No.: PCT/JP99/04489

§ 371 Date: Apr. 19, 2000

§ 102(e) Date: Apr. 19, 2000

(87) PCT Pub. No.: WO00/11062

PCT Pub. Date: Mar. 2, 2000

(30) Foreign Application Priority Data

Aug. 20, 1998 (JP) .................................. 10-234206

(51) Int. Cl.⁷ .................... C08K 5/02; C08L 63/02
(52) U.S. Cl. .................... 523/462; 525/524
(58) Field of Search ..................... 523/462; 525/524

(56) References Cited

U.S. PATENT DOCUMENTS 5,419,946 A    5/1995  Takanezawa et al.
5,646,204 A *  7/1997  Akiba .................... 523/443
5,854,325 A   12/1998  Hosomi et al.

FOREIGN PATENT DOCUMENTS

DE   1 099 733    2/1961
JP   2-225580     9/1990

OTHER PUBLICATIONS

Lee & Neville, Handbook of Epoxy Resins, p. 10–16, 1967.*

* cited by examiner

Primary Examiner—Robert Dawson
Assistant Examiner—D. Aylward
(74) Attorney, Agent, or Firm—Young & Thompson

(57) ABSTRACT

A curable composition for build-up which comprises (A) a bisepoxy compound represented by formula (I) shown below and (B) a polyepoxy compound having a polyhydric phenol skeleton at a weight ratio (A)/(B) of 3/97 to 20/80.

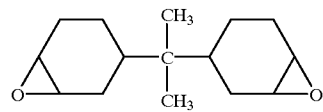

(I)

4 Claims, 1 Drawing Sheet

CURABLE COMPOSITION

TECHNICAL FIELD

The present invention relates to a curable composition for build-up which comprises a specific epoxy compound. More particularly, it relates to a curable composition for build-up having a high glass transition temperature, excellent electrical characteristics, mechanical strength, and a small water absorption, which is characterized by comprising 2,2-bis(3,4-epoxycyclohexyl)propane (hereinafter referred to as DCA) and a polyepoxy compound having a polyhydric phenol skeleton in a specific range of ratio.

BACKGROUND ART

A full additive process for producing a high-density printed circuit board, in which a plating resist finally becomes an insulating layer between wires, which makes it possible to prevent positional deviations in superposing printed circuit boards and is suitable for building up printed circuit boards having high aspect ratio wiring.

The plating resist remaining on the printed circuit board as an insulating layer is required to have a high glass transition temperature, a high volume resistivity, high mechanical characteristics, and a low water absorption so as to cope with the heat generation by the highly integrated circuit, reduction of the insulating layer thickness, and reduction in adhesive strength between the conductor layer and the insulating layer.

It is widely known to use an epoxy as an insulating layer. German Patent 1099733 discloses curing of DCA with an acid anhydride, and Japanese Patent Application Laid-Open No. 225580/90 describes curing of DCA with a initiator for cationic photopolymerization. However, a cured product obtained by curing DCA with phthalic anhydride or a photopolymerization initiator is brittle and impractical.

A cured product obtained from an epoxy compound having a polyhydric phenol skeleton, such as bisphenol A diglycidyl ether, and an acid anhydride is impractical for build-up due to its low glass transition temperature.

Accordingly, an object of the present invention is to provide a curable composition having a high glass transition temperature, excellent electrical characteristics, mechanical strength, and a low water absorption.

DISCLOSURE OF THE INVENTION

The present inventors have conducted extensive investigation and found as a result that a curable composition comprising a mixture of DCA and an epoxy compound having a polyhydric phenol skeleton at a specific ratio accomplishes the above-described object.

Having been completed based on the above finding, the present invention provides a curable composition for build-up which comprises (A) a bisepoxy compound represented by formula (I) shown below and (B) a polyepoxy compound having a polyhydric phenol skeleton at a weight ratio (A)/(B) of 3/97 to 20/80.

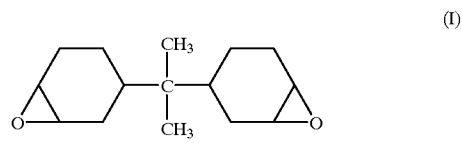

(I)

BEST MODE FOR CARRYING OUT THE INVENTION

Figure 1:
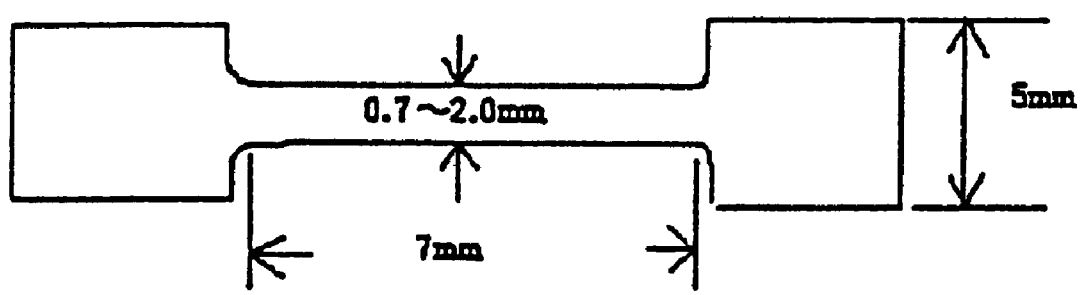
FIG. 1 is a plane view of a test piece used in Examples in a tensile test.

The curable composition according to the present invention will hereinafter be described in detail.

The polyepoxy compound having a polyhydric phenol skeleton which can be used in the present invention as component (B) includes a glycidyl ether compound of a polyhydric phenol, such as hydroquinone, resorcinol, bisphenol A, bisphenol F, 4,4-dihydroxybiphenyl, novolak, and tetrabromobisphenol A, and a glycidyl ether compound of an ethylene oxide- or propylene oxide-added polyether compound of the above-described polyhydric phenol compound.

Specific examples of the polyepoxy compounds having a polyhydric phenol skeleton as component (B) include the following compound Nos. 1 to 5. Note that the present present invention is by no means limited thereby.

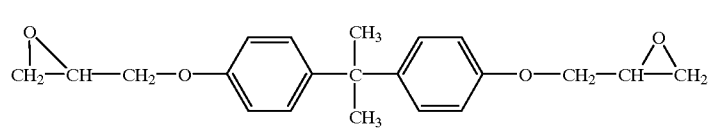

Compound No.1

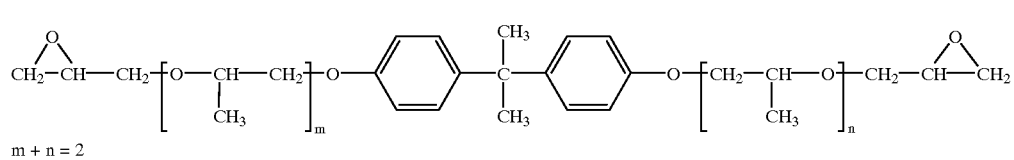

Compound No.2 m + n = 2

-continued

Compound No.3

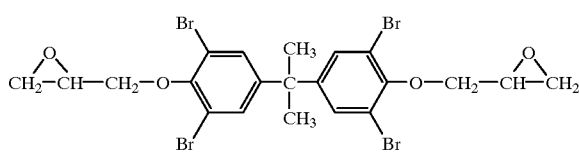

Compound No.4

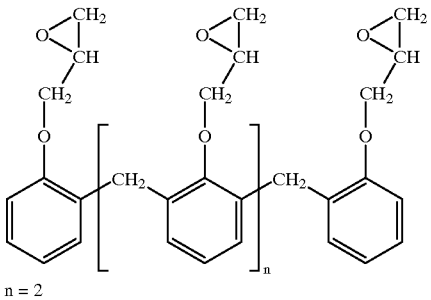

n = 2

Compound No.5

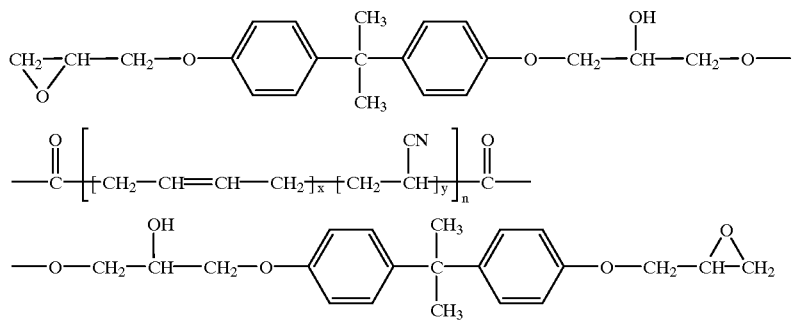

x = 5, y = 1, n = 11

The bisepoxy compound represented by formula (I) and the polyepoxy compound having a polyhydric phenol skeleton are used in the present invention as components (A) and (B), respectively, at a weight ratio of 3/97 to 20/80, preferably 5/95 to 15/85. If the ratio of component (A) is less than 3/97, the effect of component (A) is not obtained, only to provide a cured product having a low glass transition temperature. If component (A) is used in larger ratio than 20/80, the resulting cured product becomes brittle. Such a composition is not suited as an insulating material for build-up because the insulating layer will be separated or broken by shocks during build-up of the substrates or during use of the final product.

The total content of components (A) and (B) in the curable composition of the present invention preferably ranges 20 to 80% by weight. Out of this range, the resulting cured product may tend to have reduced physical properties.

It is preferred for the curable composition of the present invention to contain various. additives commonly employed in epoxy resin compositions, such as curing agents, cure accelerators, screen printability improving agents, flame retardants, flame retardation assistants, and dispersibility improving agents, according to necessity.

The curing agents include latent curing agents, polyamine compounds, polyphenol compounds, and cationic photoinitiators.

The latent curing agents include dicyandiamide, hydrazides, imidazole compounds, amine adducts, sulfonium salts, onium salts, ketimines, acid anhydrides, and tertiary amines. The acid anhydrides include phthalic anhydride, trimellitic anhydride, pyromellitic anhydride, tetrahydrophthalic anhydride, hexahydrophthalic anhydride, maleic anhydride, and succinic anhydride. These latent curing agents are preferred because they are capable of formulating a one-pack type curable composition, which is easy to handle.

The polyamine compounds include aliphatic polyamines, such as ethylenediamine, diethylenetriamine, and triethylenetetramine; alicyclic polyamines, such as menthenediamine:, isophoronediamine, bis(4-amino-3-methylcyclohexyl)methane, bis(aminomethyl)cyclohexane, and 3,9-bis(3-aminopropyl)-2,4,8,10-tetraoxaspiro[5.5]undecane; aliphatic amines having an aromatic ring, such as m-xylenediamine; and aromatic polyamines, such as m-phenylenediamine, 2,2-bis(4-aminophenyl)propane, diaminodiphenylmethane, diaminodiphenyl sulfone, and α,α-bis(4-aminophenyl)-p-diisopropylbenzene.

The polyphenol compounds include phenol novolak, o-cresol novolak, t-butylphenol novolak dicyclopentadiene cresol, terpene diphenol, terpene dicatechol, 1,1,3-tris(3-t-butyl-4-hydroxy-6-methylphenyl)butane, and butylidenebis (3-t-butyl-4-hydroxy-6-methylphenyl).

In particular, novolak is a preferred curing agent.

The cure accelerators include triphenylphosphine, diazabicycloundecene, and 2,4,6-tris(dimethylaminomethyl)phenol.

The flame retardants include halogen type flame retardants, phosphorus type flame retardants, and inorganic flame retardants. Halogen type flame retardants are preferred because high flame retardance is required of wiring boards to be built up. However, since use of a halogen type flame retardant alone in an amount enough to impart sufficient flame retardance can result in reduction of physical properties of the resin, it is preferred to use an antimony oxide compound in combination. It is still preferred to use a phosphorus type flame retardant in combination therewith, which will further enhance the flame retardance without impairing the physical properties of the cured product.

The halogen type flame retardants include halogenated epoxy compounds, halogenated chain extenders, halogenated curing agents, and others. The halogenated epoxy compounds include halogenated bisphenols, such as tetrabromobisphenol A diglycidyl ether and tetrabromobisphenol F diglycidyl ether, and diglycidyl ethers of alkylene oxide-added halogenated bisphenols. The halogenated chain extenders include halogenated bisphenol compounds, such as tetrabromobisphenol A The halogenated curing agents include halogenated compounds of aromatic carboxylic acid anhydrides, aromatic polyamines, and polyphenols. The other halogen type flame retardants include decabromodiphenyl ether, octabromodiphenyl ether, hexabromocyclododecane, bistribromophenoxyethane, ethylenebistetrabromophthalimide, and brominated polystyrene.

The phosphorus type flame retardants include triphenyl phosphate, trisnonylphenyl phosphate, tetraphenylresorcinol diphosphate, tetraphenylhydroquinone diphosphate, tetraphenylbisphenol A diphosphate, tetrakis(2,6-dimethylphenyl)resorcinol diphosphate, tetrakis(2,6-dimethylphenyl)hydroquinone diphosphate, tetrakis(2,6-dimethylphenyl)bisphenol A diphosphate, and mixtures of these phosphoric ester compounds.

The antimony oxide compounds include antimony trioxide and antimony pentoxide.

Where the halogen type flame retardant and the antimony oxide compound are used in combination it is preferred to use a bromine-containing compound as a halogen type flame retardant in an amount of 5 to 30% by weight based on the epoxy compound and the antimony oxide compound in an amount of 3 to 20% by weight based on the epoxy compound. Out of these ranges, flame retardance tends to be insufficient, or the cured product tends to have insufficient mechanical strength.

The curable composition of the present invention is preferably made flame-retardant by incorporating at least one of (a) a brominated epoxy compound, (b) a brominated chain extender, (c) a brominated curing agent, and (d) a bromine type flame retardant to give a bromine content of 5 to 30% by weight.

The curable composition of the present invention is a curable composition for build-up useful in built-up laminated substrates.

The curable composition of the present invention will now be illustrated in greater detail by way of Examples, but the present invention is not deemed to be limited thereto.

EXAMPLE 1

The components shown in Tables 1 and 2 below are mixed up thoroughly and applied to a surface-treated aluminum substrate with a knife coater to a dry film thickness of 30 µm, dried at 80° C. for 5 minutes, and baked at 150° C. for 30 minutes to obtain a cured film.

TABLE 1

(part by weight)

| | Example | | | | | |
|---|---|---|---|---|---|---|
| | 1-1 | 1-2 | 1-3 | 1-4 | 1-5 | 1-6 |
| Compound No. 1 | 95 | 90 | 85 | | | |
| Compound No. 2 | | | | 90 | | |
| Compound No. 3 | | | | | 90 | |
| Compound No. 4 | | | | | | 90 |
| Compound No. 5 | | | | | | |
| DCA | 5 | 10 | 15 | 10 | 10 | 10 |
| Curing Agent*1 | 81 | 83 | 85 | 71 | 53 | 55 |
| Cure Accelerator*2 | 1.01 | 1.04 | 1.06 | 0.89 | 0.66 | 0.69 |
| Decabro*3 | 45 | 46 | 46 | 43 | 38 | 39 |
| Sb$_2$O$_3$ | 18 | 18 | 19 | 17 | 15 | 16 |
| Leveling Agent*4 | 0.14 | 0.14 | 0.15 | 0.14 | 0.12 | 0.12 |
| Silica Filler | 7.2 | 7.3 | 7.4 | 6.8 | 6.1 | 6.2 |

Note:
*1: Tetrahydromethylphthalic acid anhydride
*2: 2,4,6-Tris(dimethylaminomethyl)phenol
*3: Decabromobiphenyl ether
*4: Florade FC-430 (fluorine-containing surface active agent, produced by 3M, U.S.A.)

TABLE 2

(part by weight)

| | | Comparative Example | | | | |
|---|---|---|---|---|---|---|
| | Ex.1-7 | 1-1 | 1-2 | 1-3 | 1-4 | 1-5 |
| Compound No. 1 | 90 | 100 | 98 | 70 | 50 | |
| Compound No. 2 | | | | | | |
| Compound No. 3 | | | | | | |
| Compound No. 4 | | | | | | |
| Compound No. 5 | 5 | | | | | |
| DCA | 5 | | 2 | 30 | 50 | 100 |
| Curing Agent*1 | 77 | 78 | 79 | 92 | 102 | 126 |
| Cure Accelerator*2 | 0.96 | 0.98 | 0.99 | 1.15 | 1.28 | 1.58 |
| Decabro*3 | 44 | 45 | 45 | 48 | 51 | 57 |
| Sb$_2$O$_3$ | 18 | 18 | 18 | 19 | 20 | 23 |
| Leveling Agent*4 | 0.14 | 0.14 | 0.14 | 0.15 | 0.16 | 0.18 |
| Silica Filler | 7.1 | 7.1 | 7.2 | 7.7 | 8.1 | 9.0 |

The volume resistivity (Vr) and the glass transition temperature (Tg) of the resulting cured film were measured in accordance with JIS K6911 and JIS K7198, respectively. The water absorption of the cured film was measured from the weight gain after 24-hour immersion in distilled water at room temperature. The results obtained are shown in Tables 3 and 4 below.

The tensile strength and elongation were measured as follows. The above-described composition was applied on an aluminum plate (75×120 mm) with a #70 bar coater and cured in a heating oven at 150° C. for 1 hour. After cooling, the cured product was peeled off the aluminum plate, and a test piece of the shape shown in FIG. 1 was cut out of the cured product and subjected to a tensile test with a tribogear (tensile strength and elongation test). The results obtained are shown in Tables 3 and 4.

TABLE 3

|  | Example | | | | | |
|---|---|---|---|---|---|---|
|  | 1-1 | 1-2 | 1-3 | 1-4 | 1-5 | 1-6 |
| VR ($10^{15}$ Ωcm) | 1.4 | 1.5 | 1.5 | 1.6 | 1.5 | 1.4 |
| Tg (° C.) | 156 | 160 | 163 | 160 | 160 | 160 |
| Water Absorption (%) | 0.3 | 0.3 | 0.2 | 0.3 | 0.3 | 0.2 |
| Tensile Strength (MPa) | 95 | 93 | 92 | 96 | 92 | 96 |
| Elongation (%) | 18 | 16 | 15 | 18 | 17 | 17 |

TABLE 4

|  |  | Comparative Example | | | | |
|---|---|---|---|---|---|---|
|  | Ex. 1-7 | 1-1 | 1-2 | 1-3 | 1-4 | 1-5 |
| VR ($10^{15}$ Ωcm) | 1.5 | 1.2 | 1.3 | 1.6 | 1.6 | 1.6 |
| Tg (° C.) | 155 | 80 | 116 | 168 | 173 | 190 |
| Water Absorption (%) | 0.2 | 1.0 | 0.8 | 0.2 | 0.2 | 0.2 |
| Tensile Strength (MPa) | 93 | 24 | 53 | 88 | 67 | 47 |
| Elongation (%) | 21 | 14 | 15 | 8 | 6 | 2 |

EXAMPLE 2

A cured product was obtained in the same manner as in Example 1, except for using the composition shown in Table 5 below. The volume resistivity, glass transition temperature, water absorption, tensile strength, and elongation of the cured product were measured in the same manner as in Example 1. Further, the flame retardance of the cured product was evaluated based on UL-94 standard. The results obtained are shown in Table 6 below.

TABLE 5

13/20 (part by weight)

|  | Example | | | | Compara. Example | |
|---|---|---|---|---|---|---|
|  | 2-1 | 2-2 | 2-3 | 2-4 | 2-1 | 2-2 |
| Compound No. 4 | 85 | 85 | 85 | 85 |  | 85 |
| Comparative Compound*[5] |  |  |  |  |  | 15 |
| DCA | 15 | 15 | 15 | 15 | 100 |  |
| Curing Agent 1*[1] | 85.9 |  |  |  | 78.6 | 84.7 |
| Curing Agent 2*[6] |  | 53.5 |  |  |  |  |
| Curing Agent 3*[7] |  |  | 46.0 |  |  |  |
| Curing Agent 4*[8] |  |  |  | 1.0 |  |  |
| Cure Accelerator*[2] | 1.07 | 0.67 | 0.58 |  | 0.98 | 1.06 |
| Phosphorus Type Flame Retardant*[9] | 47 | 39 | 37 | 25 | 45 | 46 |
| $Sb_2O_3$ | 33 | 27 | 26 | 18 | 32 | 32 |
| Silica Filler | 27 | 22 | 21 | 14 | 26 | 26 |

Note:
*[5]: 3,4-Epoxycyclohexylmethyl 3,4-epoxycyclohexylcarboxylate
*[6]:

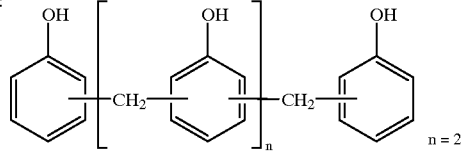

*[7]: Terpene dicatechol

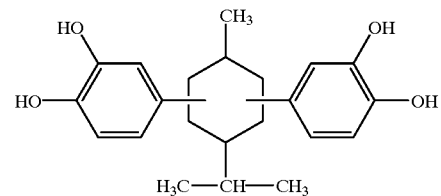

*[8]: Cationic initiator

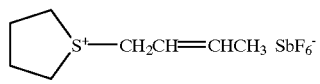

TABLE 5-continued

13/20 (part by weight)

| | Example | | | | Compara. Example | |
|---|---|---|---|---|---|---|
| | 2-1 | 2-2 | 2-3 | 2-4 | 2-1 | 2-2 |

*9:

[structure shown: bis(2,6-dimethylphenyl) phosphate ester of bisphenol A]

TABLE 6

| | Example | | | | Compara. Example | |
|---|---|---|---|---|---|---|
| | 2-1 | 2-2 | 2-3 | 2-4 | 2-1 | 2-2 |
| Vr ($10^{15}$ Ωcm) | 1.5 | 1.5 | 1.5 | 1.5 | 1.2 | 1.3 |
| Water Absorption (%) | 0.3 | 0.3 | 0.3 | 0.3 | 0.5 | 0.5 |
| Tg (° C.) | 220 | 210 | 210 | 190 | 250 | 110 |
| Elongation (%) | 12 | 13 | 13 | 12 | 3 | 14 |
| Flame Retardance | V0 | V0 | V0 | V0 | V0 | V0 |
| Tensile Strength (MPa) | 130 | 120 | 130 | 110 | 40 | 70 |

Industrial Applicability

The curable composition according to the present invention provides built-up laminated substrates possessing excellent volume resistivity, mechanical strength, and flame retardance.

What is claimed is:

1. A curable composition for build-up which comprises (A) a bisepoxy compound represented by formula (I) shown below and (B) a polyepoxy compound having a polyhydric phenol skeleton selected from a glycidyl ether compound of hydroquinone, resorcinol, bisphenol A, bisphenol F, 4,4-dihydroxybiphenyl, novolak, and tetrabromobisphenol A, and a glycidyl ether compound of an ethylene oxide-or propylene oxide-added polyether compound of the above-described polyhydic phenol compound at a weight ratio (A)/(B) of 3/97 to 20/80

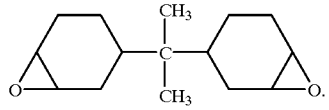

2. A curable composition for build-up as set forth in claim 1, which is a one-pack type curable composition containing a latent curing agent.

3. A curable composition for build-up as set forth in claim 1, which is made flame-retardant by incorporating at least one of (a) a brominated epoxy compound, (b) a brominated chain extender, (c) a brominated curing agent, and (d) a bromine type flame retardant to give a bromine content of 5 to 30% by weight.

4. A curable composition for build-up as set forth in claim 1, wherein novolak is used as a curing agent.

* * * * *